(12) United States Patent  
Kim

(10) Patent No.: US 7,547,600 B2
(45) Date of Patent: Jun. 16, 2009

(54) FIVE CHANNEL FIN TRANSISTOR AND METHOD FOR FABRICATING THE SAME

(75) Inventor: Kwang-Ok Kim, Kyoungki-do (KR)

(73) Assignee: Hynix Semiconductor Inc., Ishon-shi (KR)

( * ) Notice: Subject to any disclaimer, the term of this patent is extended or adjusted under 35 U.S.C. 154(b) by 132 days.

(21) Appl. No.: 11/476,261

(22) Filed: Jun. 27, 2006

(65) Prior Publication Data

US 2007/0145409 A1 Jun. 28, 2007

(30) Foreign Application Priority Data

Dec. 27, 2005 (KR) .................. 10-2005-0130534

(51) Int. Cl.
*H01L 21/336* (2006.01)
(52) U.S. Cl. .................. 438/257; 438/259; 438/593; 257/E21.624
(58) Field of Classification Search ............ 438/257, 438/259, 593; 257/E21.624
See application file for complete search history.

(56) References Cited

U.S. PATENT DOCUMENTS

| 6,720,619 | B1 * | 4/2004 | Chen et al. | ................ | 257/347 |
| 7,217,623 | B2 * | 5/2007 | Kim et al. | ................ | 438/283 |
| 7,317,230 | B2 * | 1/2008 | Lee et al. | ................ | 257/401 |
| 7,371,638 | B2 * | 5/2008 | Cho et al. | ................ | 438/257 |
| 2005/0184283 | A1 | 8/2005 | Maeda et al. | | |
| 2005/0208715 | A1 | 9/2005 | Seo et al. | | |

FOREIGN PATENT DOCUMENTS

| KR | 10-2005-0075697 A | 7/2005 |
| KR | 1020050082763 A | 8/2005 |
| KR | 10-2005-0112029 A | 11/2005 |
| KR | 1020050114153 A | 12/2005 |

OTHER PUBLICATIONS

State Intellectual Property Office of People's Republic of China; Office Action dated Jun. 6, 2008; Application No. 200610150790.7.

* cited by examiner

*Primary Examiner*—Charles D. Garber
*Assistant Examiner*—Stanetta D Isaac
(74) *Attorney, Agent, or Firm*—Townsend and Townsend and Crew LLP

(57) ABSTRACT

A semiconductor device comprises a substrate defining a recessed active region and a fin active region connected to the recessed active region and extending above the recessed active region. The fin active region includes first, second, third, fourth, and fifth sides. The first and second sides are proximate the recessed active region. The fifth side is an upper side of the fin active region. The third side is provided between the first side and the fifth side. The fourth side is provided between the second side and the fifth side. A gate insulation layer is formed over the first, second, third, fourth, and fifth sides of the fin active region. A gate electrode layer is formed over the gate insulation layer to substantially surround the first, second, third, fourth, and fifth sides of the fin active region. The first, third, and fifth sides have substantially different slopes. The third and fourth sides are curved surfaces.

13 Claims, 6 Drawing Sheets

FIVE CHANNEL FIN TRANSISTOR AND METHOD FOR FABRICATING THE SAME

CROSS REFERENCE TO RELATED APPLICATIONS

The present application claims priority to Korean patent application number 10-2005-0130534, filed on Dec. 27, 2005, which is incorporated by reference in its entirety.

BACKGROUND OF THE INVENTION

The present invention relates to a method for fabricating a semiconductor device, and more particularly to a semiconductor device having a five-channel fin transistor and a method for fabricating the same.

As the semiconductor memory device shrinks in size ever smaller, the conventional planar transistor with a stacked gate structure and a lateral channel has been becoming more susceptible to short channel effects. The contact area between an active region and a gate also has been decreasing, which degrades the operation current capability of the transistor. These effects tend to cause the conventional semiconductor device with planar transistors to have an increased leakage current, degraded refresh property, and lowered reliability. As a result, it has been difficult to reduce the size of a semiconductor device utilizing the planar transistor technology.

BRIEF SUMMARY OF THE INVENTION

Embodiments of the present invention are directed to a semiconductor device having a fin transistor with an increased channel area. According to one embodiment, the fin transistor is provided with five channels.

In one embodiment, a semiconductor device comprises a substrate defining a recessed active region and a fin active region connected to the recessed active region and extending above the recessed active region. The fin active region includes first, second, third, fourth, and fifth sides. The first and second sides are proximate the recessed active region. The fifth side is an upper side of the fin active region. The third side is provided between the first side and the fifth side. The fourth side is provided between the second side and the fifth side. A gate insulation layer is formed over the first, second, third, fourth, and fifth sides of the fin active region. A gate electrode layer is formed over the gate insulation layer to substantially surround the first, second, third, fourth, and fifth sides of the fin active region. The first, third, and fifth sides have substantially different slopes. The third and fourth sides are curved surfaces.

In another embodiment, a method for fabricating a semiconductor device includes forming a first fin active region on a substrate having a recessed active region, the first fin active region extending above the recessed active region; shaping the first fin active region to a second fin active region having first, second, third, fourth, and fifth sides; forming a gate insulation layer over the second fin active region; and forming a gate electrode layer over the gate insulation layer to substantially surround the first, second, third, fourth, and fifth sides of the second fin active region.

DETAILED DESCRIPTION OF THE INVENTION

The present invention relates to semiconductor devices having fin transistors with five channels. One of the new technologies that are being studied to replace the conventional planar transistor is the fin transistor technology. The fin transistor has an active region that protrudes upward like a "fin" and a gate that covers the fin-like active region. Accordingly, the fin transistor provides a channel length that is significantly longer than the conventional planar transistor of the same size.

Figure 1:
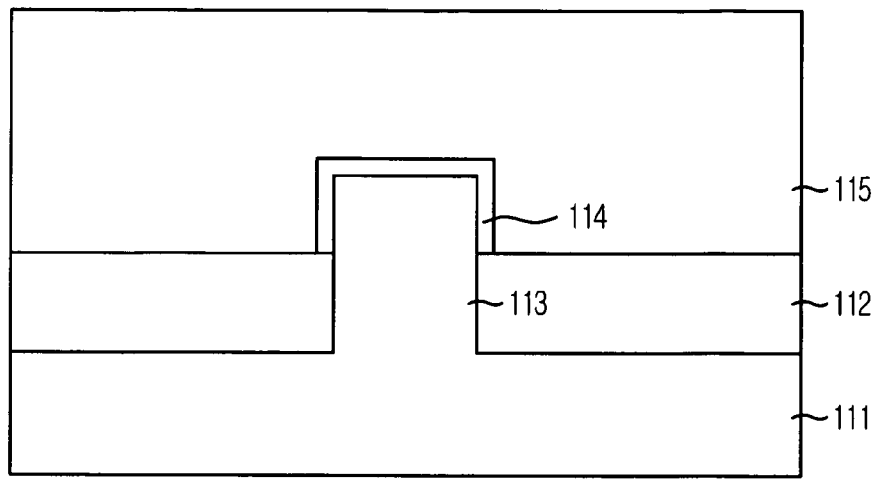
FIG. 1 illustrates a cross-sectional view of a fin transistor.

FIG. 1 illustrates a cross-sectional view of a fin transistor 100. The fin transistor 100 includes a device isolation layer 112 formed over a substrate 111. A fin active region 113 having a fin structure is formed by etching the device isolation layer 112 to a predetermined depth. A gate insulation layer 114 is formed over the fin active region 113.

A gate electrode 115 is deposited over the gate insulation layer 114 and the device isolation layer 112. Source/drain regions (not shown) are formed by performing an ion-implantation process onto lower sides of the gate electrode 115.

Figure 2:
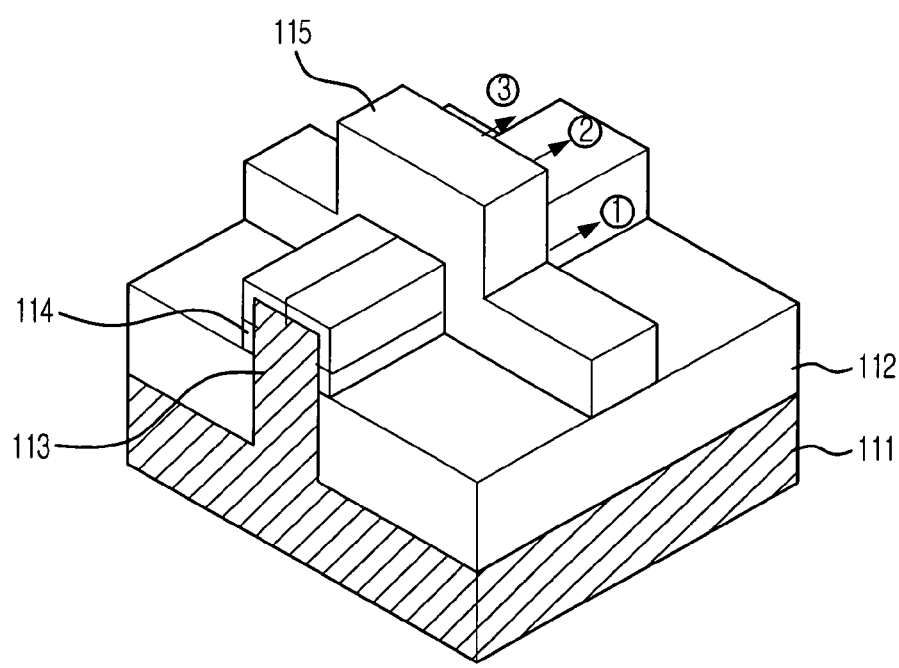
FIG. 2 illustrates a perspective view of a fin transistor.

FIG. 2 illustrates a perspective view of the fin transistor 100. The gate electrode 115 is provided along a direction perpendicular to the fin active region 113. Three channels ①, ②, and ③ are defined between the gate electrode 115 and the fin active region 113. The channels include the lateral sides ① and ③ of the active region 113 and the upper side ② of the active region 113. Although the fin transistor 100 provides three channels, it would be better to provide more channels and increase the effective channel length.

Figure 3:
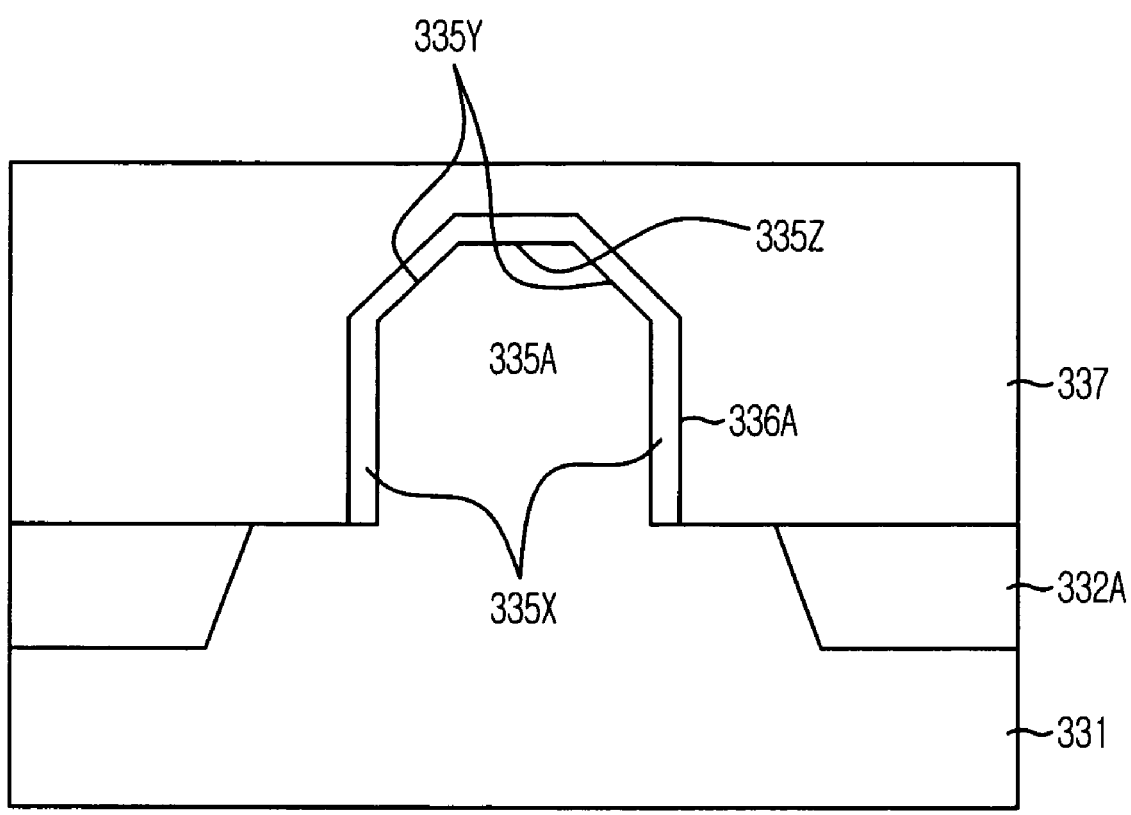
FIG. 3 illustrates a cross-sectional view of a fin transistor in accordance with a specific embodiment of the present invention.

FIG. 3 illustrates a cross-sectional view of a fin transistor 300 according to one embodiment of the present invention. A substrate 331 is selectively etched to form an etched fin active region 335A with a convex type (or protrusion). A planarized device isolation structure 332A is formed in the substrate on opposite sides of the etched fin active region 335A. A gate insulation layer 336A is formed around the etched fin active region 335A to cover the lateral and upper sides of the etched fin active region 335A. A gate electrode 337A is formed over the gate insulation layer 336A.

As shown, the etched fin active region 335A is a structure having five sides including two lateral sides 335X, an upper side 335Z and two sloped sides 335Y connecting the lateral sides 335X to the upper side 335Z. A five-channel transistor is formed using the etched fin active region 335A. The five-channels provide a longer channel length for the transistor of a given size. This makes it easier to shrink the device size since the five-channel device is less affected by the short channel effects than the planar transistor or the three-channel transistor.

Figure 4A:
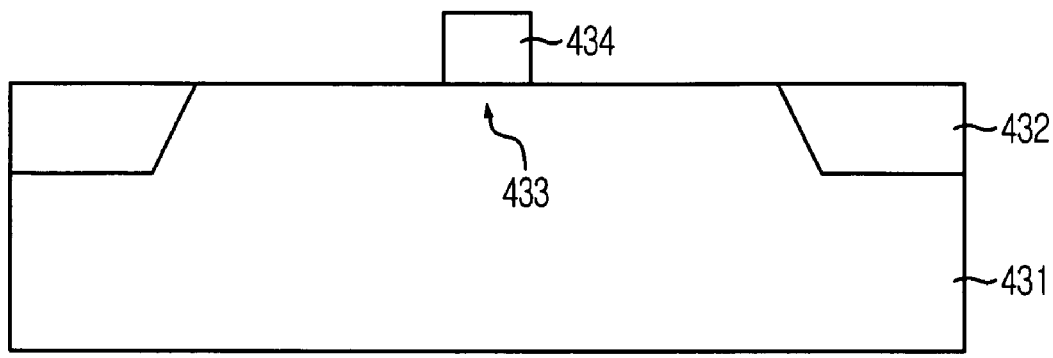
FIGS. 4A to 4G illustrate a method for fabricating the fin transistor according to one embodiment of the present invention.

FIGS. 4A to 4G illustrate a method for fabricating a fin transistor according to one embodiment of the present invention. Referring to FIG. 4A, a shallow trench isolation (STI) process is performed over predetermined portions of a substrate 431 to form device isolation structures 432 in field regions. An active region 433 is defined between the isolation structures. A first mask 434 is formed over a predetermined portion of the active region 433. A line width of the first mask 434 ranges from approximately 10 nm to approximately 100 nm.

Figure 4B:
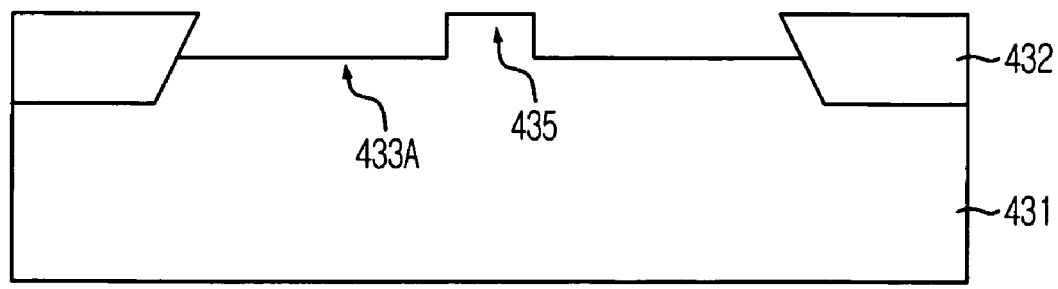

Referring to FIG. 4B, the active region 433 is etched to a predetermined thickness using the first mask 34 to define a convex-type fin active region 435. A recessed active region 433A is defined adjacent to the convex-type fin active region 435. The first mask 434 is stripped away.

Figure 4C:
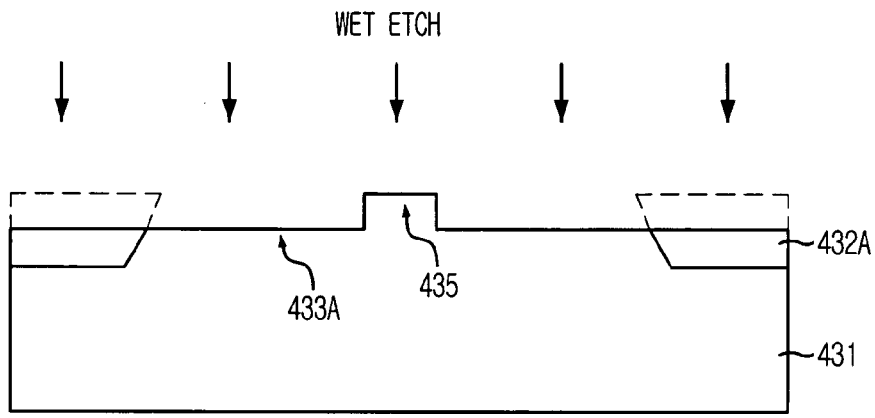

Referring to FIG. 4C, a wet etching process is performed to reduce the device isolation structure 432 to a predetermined thickness. A wet-etched device isolation structure 432A is defined by the wet etch. The wet etch process causes the convex-type fin active region 435 to extend above the upper surface of the device isolation structure 432. In the present embodiment, the upper surface of the device isolation layer 432 is substantially flushed to the upper surface of the recessed active region 433A. The sidewalls of the fin active region 435 extend above the device isolation layer 432.

Figure 4D:
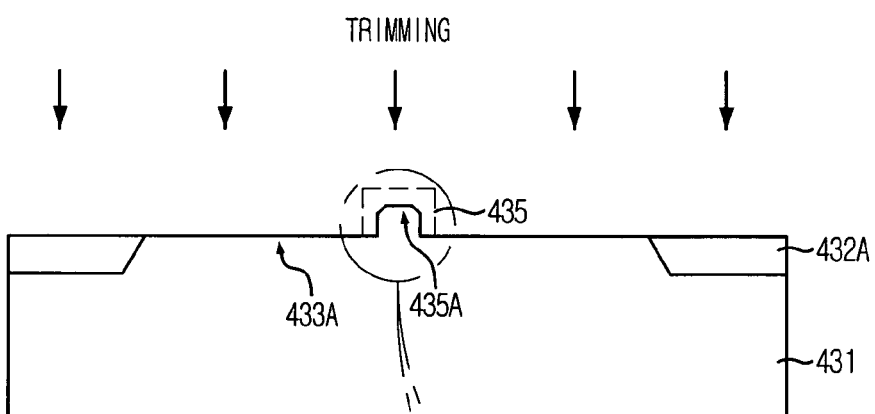
Figure 4D:
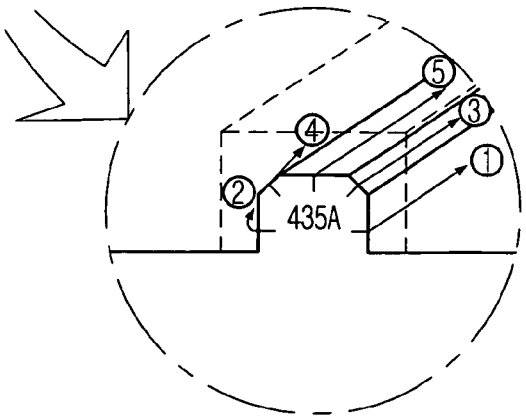

Referring to FIG. 4D, a trimming process is performed to make the size of the fin active region 435 smaller. A silicon etch-back process is used for the trimming process. The etch-back process etches all sides of the fin active region 435 since it is comprised primarily of silicon. An etched fin active region 435A is defined as a result. The etch-back process involves an isotropic etch process according to the present implementation.

The etched fin active region 435A has more sides than the fin active region 435. The fin active region 435 is a pillar having a hexahedral-like shape. The silicon etch-back process etches all sides of the fin active region 435. The upper corners of the fin active region 435, however, are etched at faster than the sidewalls of the fin active region 435. Accordingly, etched fin active region 435A has five sides ①, ②, ③, ④ and ⑤ that are exposed and could be used as channels. The upper corners of the fin active region 435 are etched by approximately 10 Å to approximately 500 Å in the present embodiment. Although the sloping sides ③ and ④ are illustrated as being substantially flat, they may be curved surfaces, so that the etched fin active region 435A may have a rounded dome-like shape at its upper portion.

As described above, the etched fin active region 435A is formed sequentially through the etching process using the first mask 34 and the silicon etch-back process has a convex shape and is disposed apart from a neighboring etched fin active region (not shown) with a predetermined distance. That is, the convex type fin active region according to the present invention is different from the conventional fin active region having one integral structure which is not separated from a neighboring active region (not shown) where a gate electrode passes.

The device of the present embedment has channels ① and ② formed along lateral sides of the etched fin active region 435A, a channel ⑤ formed along an upper side of the etched fin active region 435A, and channels ③ and ④ formed along sloped sides of the etched fin active region 435A connecting the lateral sides with the upper side. In the present embodiment, the channels ③ and ④ have curved surfaces. These five channels significantly increase an effective channel area for the transistor.

Figure 4E:
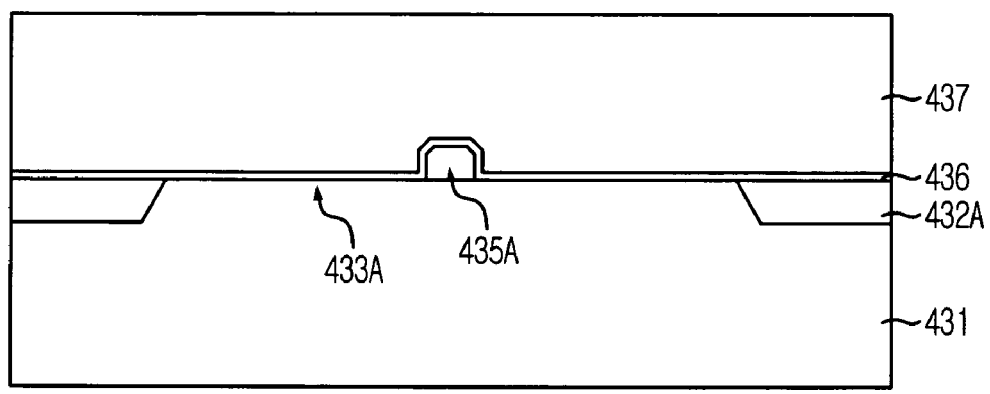

Referring to FIG. 4E, a gate insulation structure 436 and a conductive material 437 for a gate electrode are formed over the etched fin active region 435A and the recessed active region 433A. The conductive material 437 is formed to be substantially thicker than the etched fin active region 435A. The conductive material 437 is formed to a thickness of at least 100 Å in the present implementation.

In one implementation, the conductive material 437 is formed to be at least 500 Å thicker than the etched fin active region 435A. A chemical mechanical polishing (CMP) process is performed to polish and remove the conductive material. A resulting conductive material has a substantially planar upper surface. If the conductive material 437 is not planarized, the surface irregularities may cause voids or residue problem.

Figure 4F:
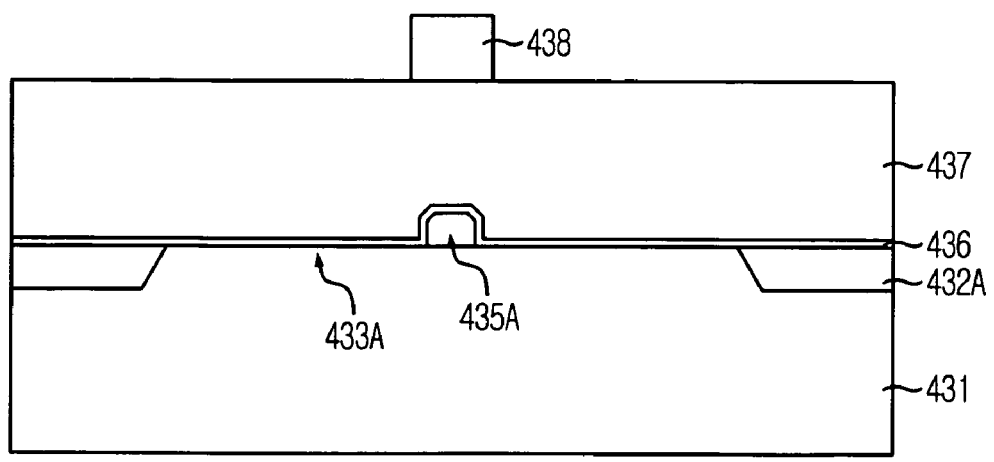

Referring to FIG. 4F, a photoresist layer (not shown) is formed over the conductive material 437 and then patterned through a photo-exposure process and a developing process, thereby forming a second mask 438. The second mask 438 is used to pattern the conductive material 437, and has a substantially identical pattern as the first mask 434.

Figure 4G:
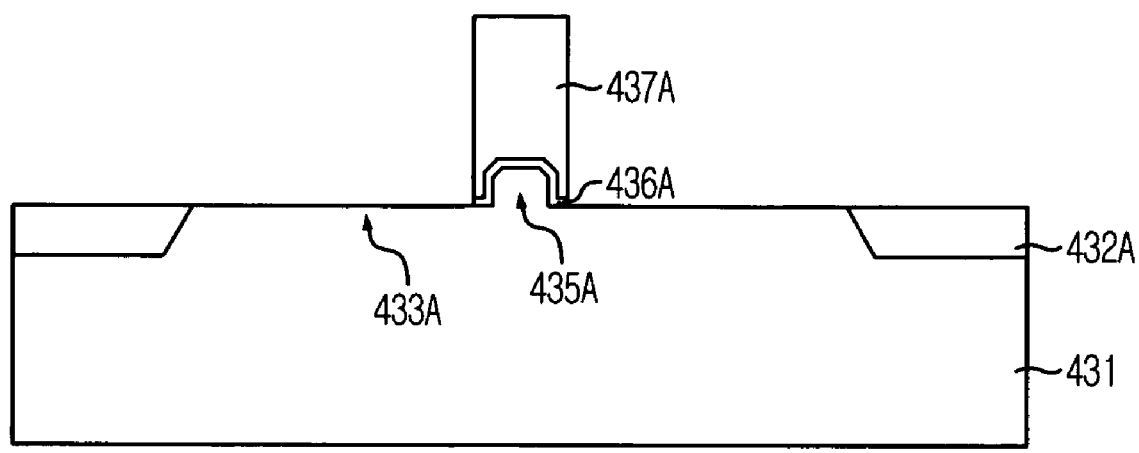

Referring to FIG. 4G, a gate electrode 437A is formed by etching the conductive material 437 using the second mask 38 as an etch mask. The gate electrode 437A substantially surrounds the etched fin active region 35A. That is, the gate electrode 437A surrounds the lateral sides, the sloped sides, and the upper side of the etched fin active region 435A to form a transistor having five channels.

The above embodiments of the present invention are illustrative and not limitative. Various alternatives and equivalents are possible. The invention is not limited by the type of deposition, etching, polishing, and patterning steps described herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A method for fabricating a semiconductor device, the method comprising:
   forming a first fin active region on a substrate having a recessed active region, the first fin active region extending above the recessed active region;
   forming a device isolation layer in the semiconductor substrate on opposite sides of the recessed active region, wherein a width of the recessed active region between the device isolation layers is greater than a width of the first fin active region;
   shaping the first fin active region to a second fin active region having first, second, third, fourth, and fifth sides;
   forming a gate insulation layer over the second fin active region; and
   forming a gate electrode layer over the gate insulation layer to substantially surround the first, second, third, fourth, and fifth sides of the second fin active region.

2. The method of claim 1, wherein the forming of the first fin active region comprises:
   etching the substrate to define the first fin active region and the recessed active region on the substrate; and
   etching each device isolation layer to a predetermined thickness, wherein each etched device isolation layer is substantially flushed to the recessed active region.

3. The method of claim 2, wherein each device isolation layer is etched by using a wet etching process.

4. The method of claim 1, wherein the first fin active region defines three channels, and the second fin active region defines five channels.

5. The method of claim 4, wherein the shaping process comprises:
   etching sidewalls and an upper side of the first fin active region by performing an etch-back process.

6. The method of claim 5, wherein the upper side and the sidewalls of the first fin active region are etched to a thickness ranging from approximately 10 Å to approximately 500 Å.

7. The method of claim 1, wherein the gate electrode layer is formed to a thickness approximately 100 Å or more.

8. The method of claim 1, wherein the forming of the gate electrode layer comprises:

forming a gate electrode layer with a thickness greater than the second fin active region by at least 500 Å; and planarizing the gate electrode layer by performing a chemical mechanical polishing (CMP) process.

9. The method of claim 8, further comprising:

patterning the planarized gate electrode layer to define a gate electrode that substantially surrounds the first, second, third, fourth, and fifth sides of the second fin active region.

10. The method of claim 9, wherein a first mask used to pattern the gate electrode layer has substantially the same pattern as a second mask used to form the first fin active region.

11. The method of claim 10, wherein a line width of the first mask ranges from approximately 10 nm to approximately 100 nm.

12. The method of claim 1, wherein the first, third, and fifth sides have substantially different slopes.

13. The method of claim 12, wherein the third and fourth sides are curved surfaces.

* * * * *